(12) United States Patent
Inamura et al.

(10) Patent No.: US 12,230,840 B2
(45) Date of Patent: Feb. 18, 2025

(54) POWER STORAGE MODULE

(71) Applicant: Prime Planet Energy & Solutions, Inc., Tokyo (JP)

(72) Inventors: Takashi Inamura, Himeji (JP); Yasumasa Kojima, Kasai (JP); Takatoshi Kageyama, Kakogawa (JP)

(73) Assignee: PRIME PLANET ENERGY & SOLUTIONS, INC., Tokyo (JP)

( * ) Notice: Subject to any disclaimer, the term of this patent is extended or adjusted under 35 U.S.C. 154(b) by 590 days.

(21) Appl. No.: 17/551,202

(22) Filed: Dec. 15, 2021

(65) Prior Publication Data

US 2022/0200103 A1 Jun. 23, 2022

(30) Foreign Application Priority Data

Dec. 21, 2020 (JP) .................. 2020-211176

(51) Int. Cl.
*H05K 1/11* (2006.01)
*H01M 50/204* (2021.01)
*H01M 50/519* (2021.01)

(52) U.S. Cl.
CPC ....... *H01M 50/519* (2021.01); *H01M 50/204* (2021.01); *H05K 1/118* (2013.01)

(58) Field of Classification Search
CPC ... H01M 50/519; H01M 50/204; H05K 1/118
USPC ...................................................... 429/100
See application file for complete search history.

(56) References Cited

U.S. PATENT DOCUMENTS

| 10,547,128 B1 * | 1/2020 | Lin ...................... H01R 12/585 |
| 2010/0098973 A1 * | 4/2010 | Lee ...................... H01M 50/119 |
| | | 429/7 |
| 2012/0298433 A1 * | 11/2012 | Ohkura ............. H01M 10/6556 |
| | | 180/65.21 |
| 2018/0198110 A1 * | 7/2018 | Zeng ........................ H02H 3/08 |

FOREIGN PATENT DOCUMENTS

| JP | H05-031122 U | 4/1993 |
| JP | 2013-105571 A | 5/2013 |
| JP | 201393307 A | 5/2013 |
| WO | 2020/054305 A1 | 3/2020 |

* cited by examiner

*Primary Examiner* — Christian Roldan
*Assistant Examiner* — Robert Gene West
(74) *Attorney, Agent, or Firm* — HAUPTMAN HAM, LLP

(57) ABSTRACT

A power storage module includes: a stack in which a plurality of power storage cells are stacked in a stacking direction; a resin plate placed on the stack of the plurality of power storage cells; a flexible printed circuit board placed on the resin plate and having an electric circuit electrically connected to the plurality of power storage cells; and a cover member provided on the resin plate so as to cover the flexible printed circuit board. The resin plate includes a projection that extends through the flexible printed circuit board. The cover member includes a tubular protrusion that protrudes toward the flexible printed circuit board on the resin plate. The projection is accommodated in an inner periphery of the tubular protrusion. The tubular protrusion is in abutment with the flexible printed circuit board at a position to avoid the electric circuit.

7 Claims, 6 Drawing Sheets

POWER STORAGE MODULE

This nonprovisional application is based on Japanese Patent Application No. 2020-211176 filed on Dec. 21, 2020, with the Japan Patent Office, the entire contents of which are hereby incorporated by reference.

BACKGROUND OF THE INVENTION

Field of the Invention

The present technology relates to a power storage module.

Description of the Background Art

A wiring module, which employs a flexible printed circuit board, for a power storage device has been conventionally known. For example, Japanese Patent Laying-Open No. 2013-93307 (PTL 1) discloses a battery wiring module in which a collective conductive path is formed by a flexible printed circuit board.

In the wiring module described in PTL 1, it is important to precisely position the flexible printed circuit board and stably fix the flexible printed circuit board. However, the conventional wiring module does not necessarily include a sufficient configuration in view of the above.

SUMMARY OF THE INVENTION

An object of the present technology is to provide a power storage module in which a flexible printed circuit board is precisely positioned and is stably fixed.

A power storage module according to the present technology includes: a stack in which a plurality of power storage cells are stacked in a stacking direction; a resin plate placed on the stack of the plurality of power storage cells; a flexible printed circuit board placed on the resin plate and having an electric circuit electrically connected to the plurality of power storage cells; and a cover member provided on the resin plate so as to cover the flexible printed circuit board. The resin plate includes a projection that extends through the flexible printed circuit board. The cover member includes a tubular protrusion that protrudes toward the flexible printed circuit board on the resin plate. The projection is accommodated in an inner periphery of the tubular protrusion. The tubular protrusion is in abutment with the flexible printed circuit board at a position to avoid the electric circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
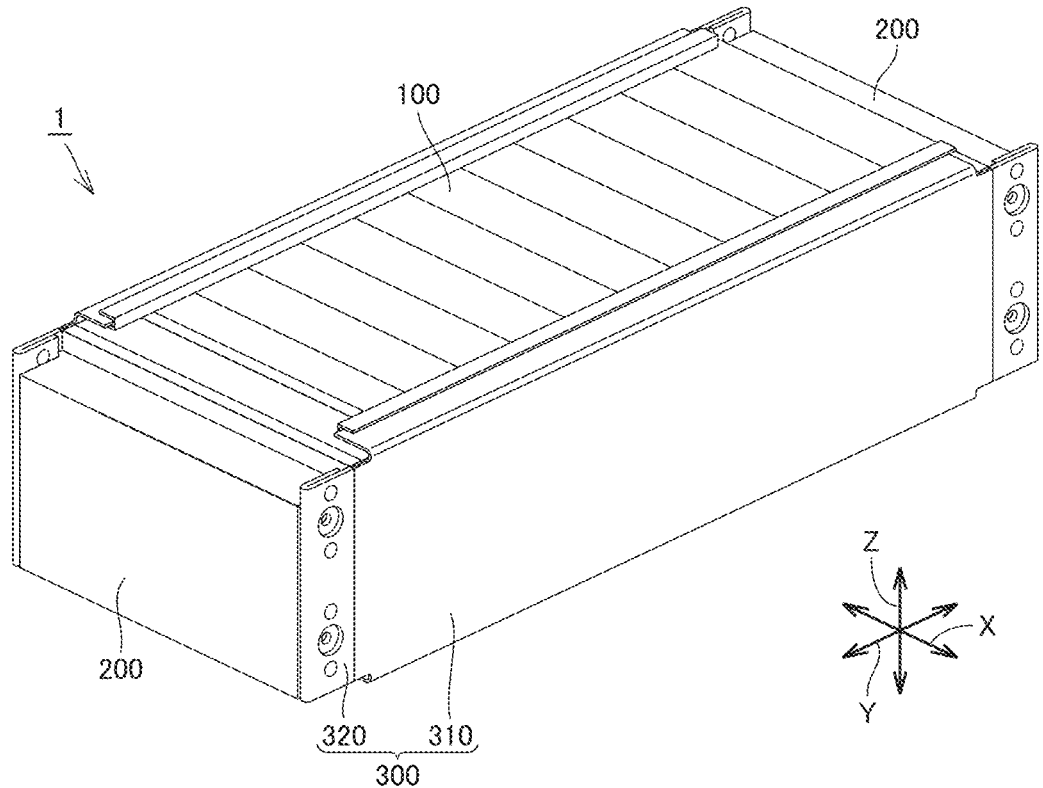
FIG. 1 is a diagram showing a basic configuration of a battery pack.

Hereinafter, embodiments of the present technology will be described. It should be noted that the same or corresponding portions are denoted by the same reference characters, and may not be described repeatedly.

It should be noted that in the embodiments described below, when reference is made to number, amount, and the like, the scope of the present technology is not necessarily limited to the number, amount, and the like unless otherwise stated particularly. Further, in the embodiments described below, each component is not necessarily essential to the present technology unless otherwise stated particularly.

It should be noted that in the present specification, the terms "comprise", "include", and "have" are open-end terms. That is, when a certain configuration is included, a configuration other than the foregoing configuration may or may not be included. Further, the present technology is not limited to one that necessarily exhibits all the functions and effects stated in the present embodiment.

In the present specification, the term "battery" is not limited to a lithium ion battery, and may include another battery such as a nickel-metal hydride battery. In the present specification, the term "electrode" may collectively represent a positive electrode and a negative electrode. Further, the term "electrode plate" may collectively represent a positive electrode plate and a negative electrode plate.

In the present specification, the "power storage cell" or the "power storage module" is not limited to a battery cell or a battery module, and may include a capacitor cell or a capacitor module.

Figure 2:
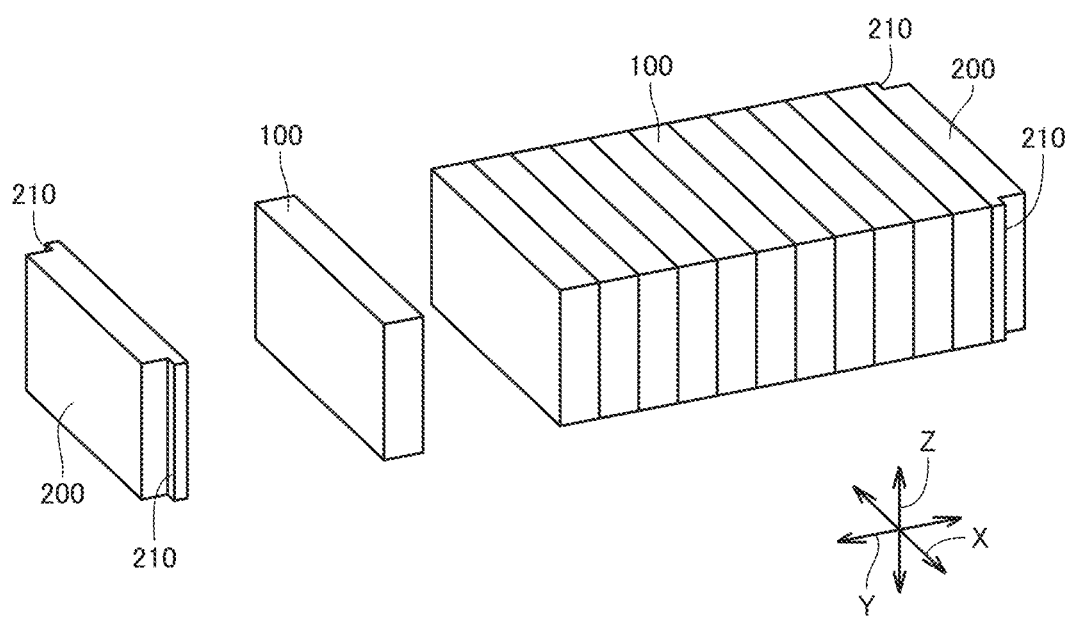
FIG. 2 is a diagram showing battery cells and end plates in the battery pack shown in FIG. 1.

FIG. 1 is a diagram showing a basic configuration of a battery pack 1. FIG. 2 is a diagram showing battery cells 100 and end plates 200 included in battery pack 1.

As shown in FIGS. 1 and 2, battery pack 1, which serves as an exemplary "power storage module", includes battery cells 100, end plates 200, and a restraint member 300.

The plurality of battery cells 100 are provided side by side in a Y axis direction (arrangement direction). Thus, a stack of battery cells 100 is formed. Each of battery cells 100 includes an electrode terminal 110. A separator (not shown) is interposed between the plurality of battery cells 100. The plurality of battery cells 100, which are sandwiched between two end plates 200, are pressed by end plates 200, and are therefore restrained between two end plates 200.

End plates 200 are disposed beside both ends of battery pack 1 in the Y axis direction. Each of end plates 200 is fixed to a base such as a case that accommodates battery pack 1. Stepped portions 210 are formed at both ends of end plate 200 in an X axis direction.

Restraint member 300 connects two end plates 200 to each other. Restraint member 300 is attached to stepped portions 210 formed on two end plates 200.

Restraint member 300 is engaged with end plates 200 with compression force in the Y axis direction being exerted to the stack of the plurality of battery cells 100 and end plates 200, and then the compression force is released, with the result that tensile force acts on restraint member 300 that connects two end plates 200 to each other. As a reaction thereto, restraint member 300 presses two end plates 200 in directions of bringing them closer to each other.

Restraint member 300 includes a first member 310 and a second member 320. First member 310 and second member 320 are coupled to each other by butt welding, for example. Tip surfaces formed by folding second member 320 are brought into abutment with stepped portions 210 of end plate 200 in the Y axis direction.

Figure 3:
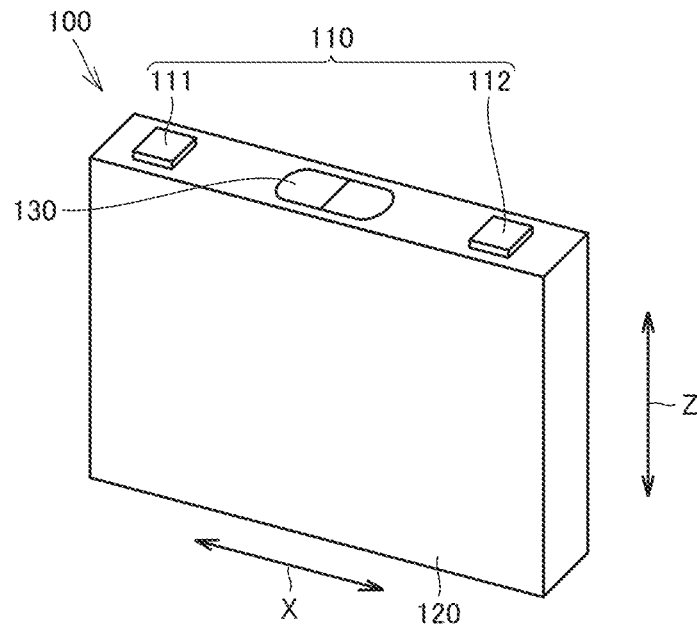
FIG. 3 is a diagram showing a battery cell in the battery pack shown in FIG. 1.

FIG. 3 is a diagram showing battery cell 100 in battery pack 1. As shown in FIG. 3, battery cell 100 includes electrode terminal 110, a housing 120, and a gas discharge valve 130.

Electrode terminal 110 includes a positive electrode terminal 111 and a negative electrode terminal 112. Electrode terminal 110 is formed on housing 120. Housing 120 is formed to have a substantially rectangular parallelepiped shape. An electrode assembly (not shown) and an electrolyte solution (not shown) are accommodated in housing 120. Gas discharge valve 130 is fractured when pressure inside housing 120 becomes equal to or more than a predetermined value. Thus, gas in housing 120 is discharged to the outside of housing 120.

Figure 4:
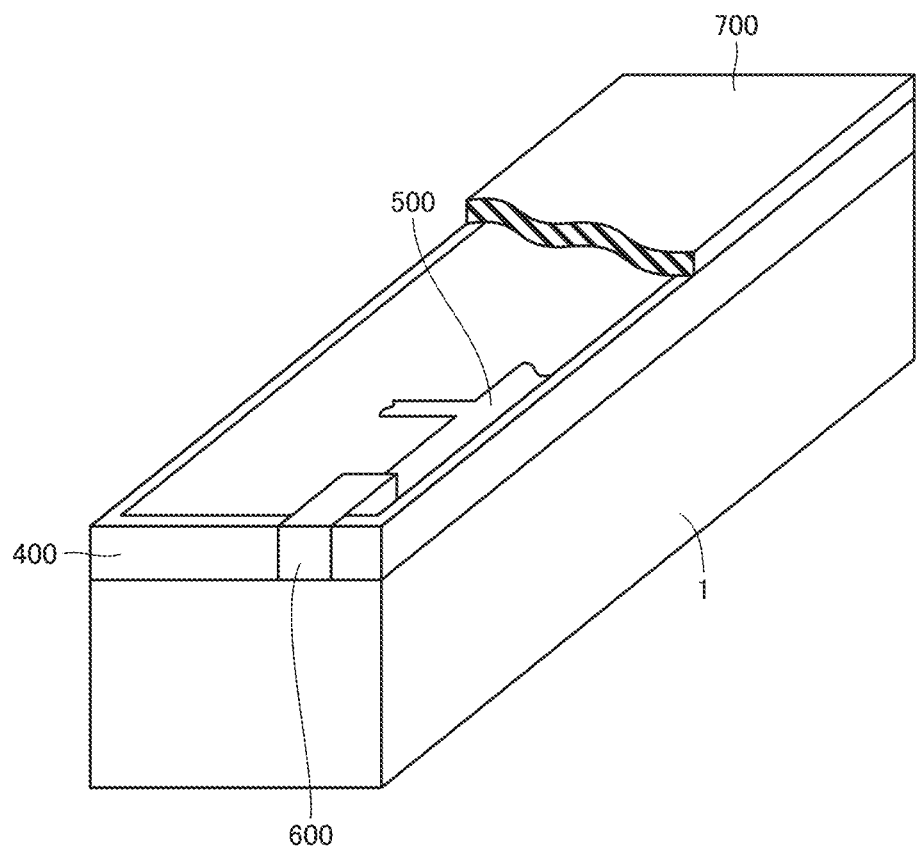
FIG. 4 is a perspective view showing a state in which a wiring module is provided on the battery pack.

FIG. 4 is a perspective view showing a state in which a wiring module is provided on battery pack 1. As shown in FIG. 4, a plate member 400 is placed on battery pack 1, and a wiring member 500 is provided on plate member 400. Wiring member 500 can be electrically connected to an external device via a connector 600. A cover member 700 is provided on plate member 400 so as to cover wiring member 500.

Figure 5:
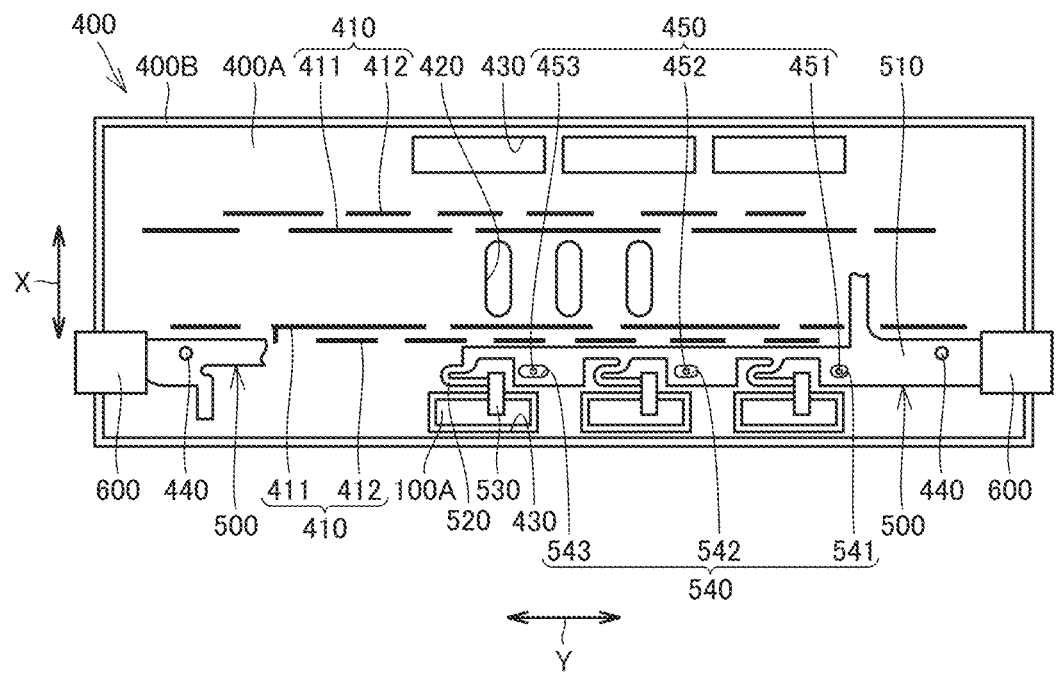
FIG. 5 is a schematic top view of the wiring module placed on the battery pack.

FIG. 5 is a schematic top view of the wiring module placed on battery pack 1. As shown in FIG. 5, the wiring module includes plate member 400, wiring member 500, and connector 600.

Plate member 400 (bus bar plate) is a resin plate having insulation property and heat resistance. Plate member 400 has: a bottom surface portion 400A; and a side surface portion 400B formed to extend upward from bottom surface portion 400A in a Z axis direction.

Plate member 400 is provided with a wall portion 410, openings 420, 430, and protrusions 440, 450.

Wall portion 410 is formed to extend upward from bottom surface portion 400A of plate member 400 in the Z axis direction. Wall portion 410 includes: a first wall portion 411 formed on the center side in the X axis direction; and a second wall portion 412 provided on the outer side in the X axis direction in parallel with first wall portion 411. Each of first wall portion 411 and second wall portion 412 is formed to extend discontinuously in the Y axis direction.

Each of first wall portion 411 and second wall portion 412 can serve as a protection wall that prevents sparking generated in plate member 400 from being directly exposed to outside while securing a path for discharging, to the outside of the battery pack, the gas discharged from housing 120 of battery cell 100.

Each of openings 420 is located above gas discharge valve 130 of battery cell 100. Each of openings 430 is located above electrode terminal 110 of battery cell 100.

Each of protrusions 440 (projections) extends through wiring member 500 in the vicinity of connector 600. Thus, connector 600 is positioned.

Protrusions 450 include a first protrusion 451, a second protrusion 452, and a third protrusion 453 in the order from the side closest to connector 600. First protrusion 451, second protrusion 452, and third protrusion 453 are formed side by side in the Y axis direction. Each of first protrusion 451, second protrusion 452, and third protrusion 453 extends through wiring member 500. The number of protrusions 450 can be appropriately changed.

Wiring member 500 includes a flexible printed circuit board 510, displacement absorbing portions 520, bus bar joining portions 530, and elongated holes 540.

Flexible printed circuit board 510 is a board in which an electric circuit is formed on a base member including a base film having an insulation property and a conductive metal foil. The base film is composed of, for example, polyimide or the like. The conductive metal foil is composed of, for example, a copper foil or the like. Flexible printed circuit board 510 has flexibility and has such a characteristic that the electric characteristics of flexible printed circuit board 510 are maintained even when deformed.

Each of displacement absorbing portions 520 is formed by forming a portion of flexible printed circuit board 510 into a substantially U-shape so as to facilitate deformation. Displacement absorbing portion 520 is connected to bus bar joining portion 530. Bus bar joining portion 530 is joined to a bus bar 100A that couples electrode terminals 110 of the plurality of battery cells 100. Thus, the electric circuit provided on flexible printed circuit board 510 and battery pack 1 are electrically connected to each other. With displacement absorbing portion 520, displacements (in the X axis direction, the Y axis direction, and the Z axis direction) of bus bar joining portion 530 can be absorbed.

Elongated holes 540 include a first elongated hole 541, a second elongated hole 542, and a third elongated hole 543 in the order from the side closest to connector 600. First elongated hole 541, second elongated hole 542, and third elongated hole 543 are formed side by side in the Y axis direction. The number of elongated holes 540 can be appropriately changed.

First protrusion 451 is inserted into first elongated hole 541. Second protrusion 452 is inserted into second elongated hole 542. Third protrusion 453 is inserted into third elongated hole 543. Second elongated hole 542 is longer than first elongated hole 541 in the Y axis direction, and third elongated hole 543 is longer than second elongated hole 542 in the Y axis direction. That is, the lengths of elongated holes 540 in the Y axis direction are longer in the direction further away from connector 600. In this way, positioning can be readily performed when placing wiring member 500 and connector 600 on plate member 400.

Connector 600 is fixed to flexible printed circuit board 510. The electric circuit in flexible printed circuit board 510 and an external electric device can be electrically connected to each other via connector 600.

Figure 6:
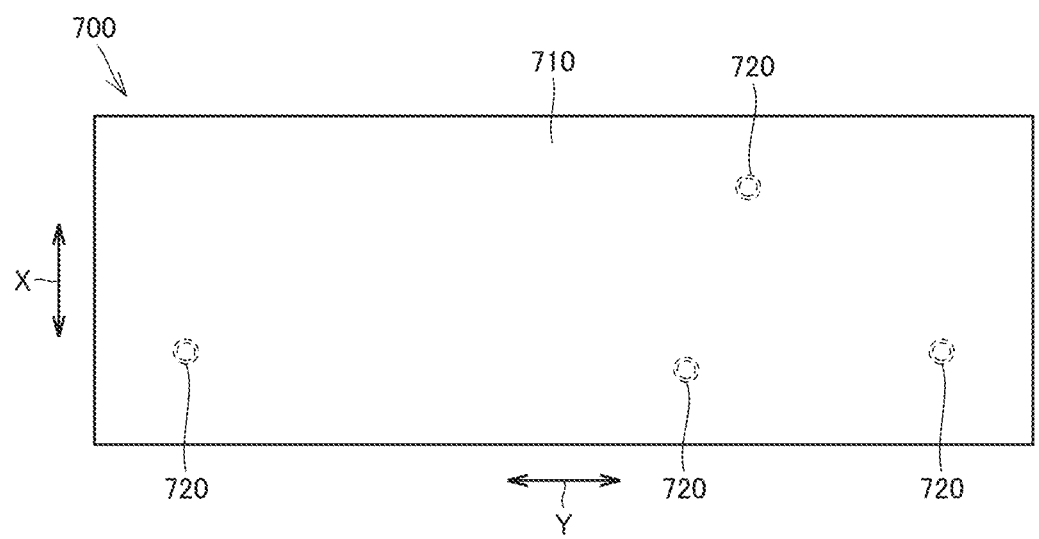
FIG. 6 is a schematic top view of a cover member that covers the wiring module.

FIG. 6 is a schematic top view of cover member 700 (bus bar cover) that covers the wiring module shown in FIG. 5. Cover member 700 is provided on plate member 400 so as to cover flexible printed circuit board 510.

As shown in FIG. 6, cover member 700 includes a main body 710 and tubular protrusions 720. Each of tubular protrusions 720 protrudes toward flexible printed circuit board 510 on plate member 400. Tubular protrusions 720 and protrusions 440, 450 are provided on both sides beside openings 420 in the X axis direction. Further, the plurality of tubular protrusions 720 and the plurality of protrusions 440, 450 are provided along the Y axis direction (stacking direction of the battery cells 100).

Figure 7:
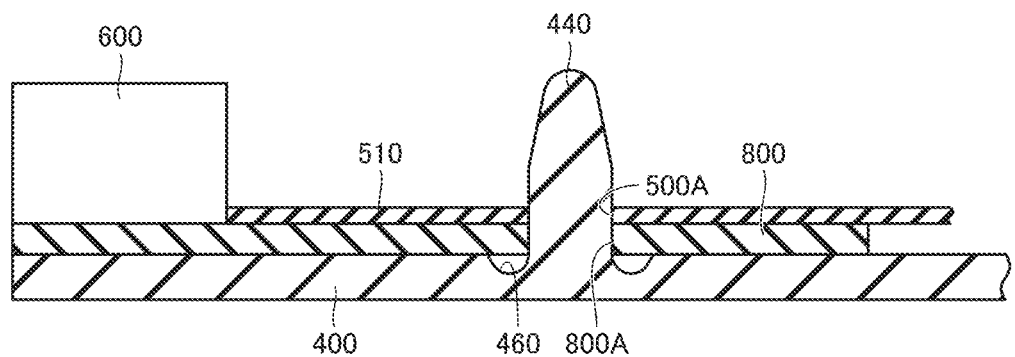
FIG. 7 is a cross sectional view of the vicinity of a connector in the wiring module.

FIG. 7 is a cross sectional view of the vicinity of connector 600 in the wiring module. As shown in FIG. 7, a substrate 800 that supports flexible printed circuit board 510 and connector 600 is provided. Substrate 800 is fixed to plate member 400. Substrate 800 is composed of, for example, a glass epoxy resin or the like. Substrate 800 is composed of a material harder than that of flexible printed circuit board 510.

Protrusion 440 of plate member 400 extends through hole portion 800A of substrate 800 and hole portion 500A of flexible printed circuit board 510. That is, plate member 400 and substrate 800 are engaged with each other by protrusion 440 of plate member 400 and hole portion 800A of substrate 800. Thus, substrate 800 and wiring member 500 can be positioned with respect to plate member 400.

Further, a groove portion 460 having an annular shape is formed in plate member 400 at the root portion of protrusion 440. Groove portion 460 has a curved contour. Accordingly, stress concentration around groove portion 460 can be relaxed.

When protrusion 440 is formed at plate member 400 by resin molding, the root portion of protrusion 440 needs to have a portion having a curved shape (shape with a curvature) for the sake of manufacturing. If the curved shape (shape with a curvature) is provided without forming groove portion 460, the diameter of the root portion of protrusion 440 becomes large, with the result that hole portion 500A of flexible printed circuit board 510 and hole portion 800A of substrate 800 have to be slightly larger. When hole portion 500A of flexible printed circuit board 510 is large, an area in which the electric circuit can be formed in flexible printed circuit board 510 is reduced. When hole portion 800A of substrate 800 is large, precision in positioning connector 600 with substrate 800 being interposed is reduced.

On the other hand, according to the structure of the present embodiment, since groove portion 460 having the curved contour is formed in bottom surface portion 400A of plate member 400 at the root portion of protrusion 440, hole portion 500A of flexible printed circuit board 510 and hole portion 800A of substrate 800 can be suppressed from being large while relaxing stress concentration around groove portion 460. As a result, the area in which the electric circuit can be formed in flexible printed circuit board 510 can be suppressed from being reduced and the precision in positioning connector 600 with substrate 800 being interposed can be suppressed from being reduced. As a result, downsizing of the module as a whole can be attained, and the power storage module in which connector 600 is positioned with high precision can be obtained.

Figure 8:
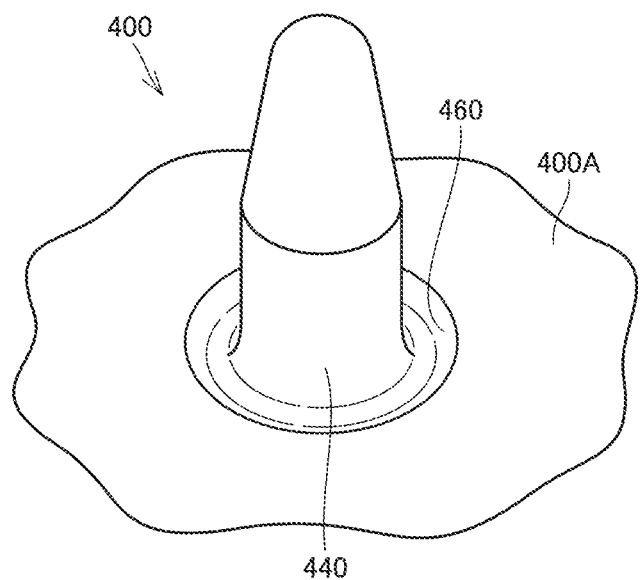
FIG. 8 is a perspective view showing the vicinity of a projection provided in a plate member of the wiring module.

FIG. 8 is a perspective view showing the vicinity of protrusion 440 of plate member 400. As shown in FIG. 8, groove portion 460 is formed to have an annular shape so as to surround the entire periphery of the root portion of protrusion 440.

Figure 9:
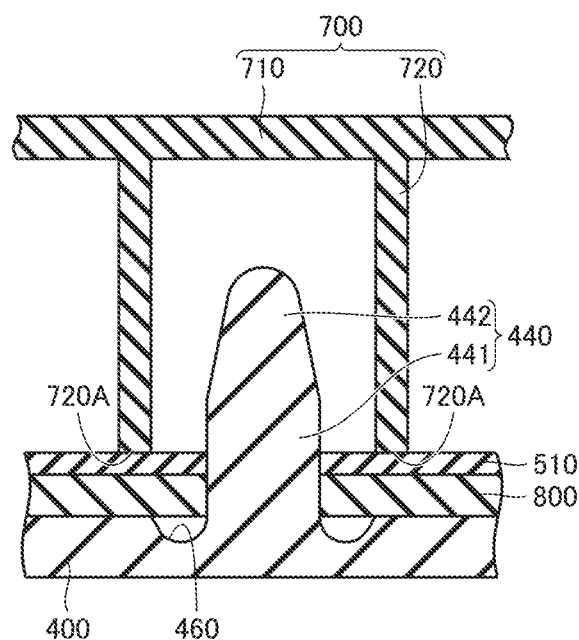
FIG. 9 is a cross sectional view showing a state in which the cover member is attached to the wiring module (the vicinity of the projection shown in FIG. 8).

FIG. 9 is a cross sectional view of the vicinity of protrusion 440 when cover member 700 is attached to the wiring module. As shown in FIG. 9, tubular protrusion 720 of cover member 700 is in abutment with flexible printed circuit board 510. Thus, wiring member 500 and substrate 800 are pressed against plate member 400 and are therefore fixed. On this occasion, protrusion 440 of plate member 400 is accommodated in the inner periphery of tubular protrusion 720. Abutment surface 720A of tubular protrusion 720 is located on the outer peripheral side with respect to groove portion 460 at the root portion of protrusion 440. According to the structure of the present embodiment, flexible printed circuit board 510 can be precisely positioned and can be stably fixed.

Protrusion 440 includes a first portion 441 and a second portion 442, first portion 441 having a side surface perpendicular to the bottom surface of plate member 400, second portion 442 being provided at a position away from the bottom surface of plate member 400 with respect to first portion 441, second portion 442 having a diameter that is reduced in a direction away from the bottom surface of plate member 400. Tubular protrusion 720 extends beyond second portion 442 to reach a position outward in a radial direction of first portion 441.

It should be noted that each of FIG. 9 and FIG. 11 described below shows protrusion 440; however, tubular protrusion 720 having the same structure is also provided above each of protrusions 450 (first protrusion 451, second protrusion 452, and third protrusion 453).

Figure 10:
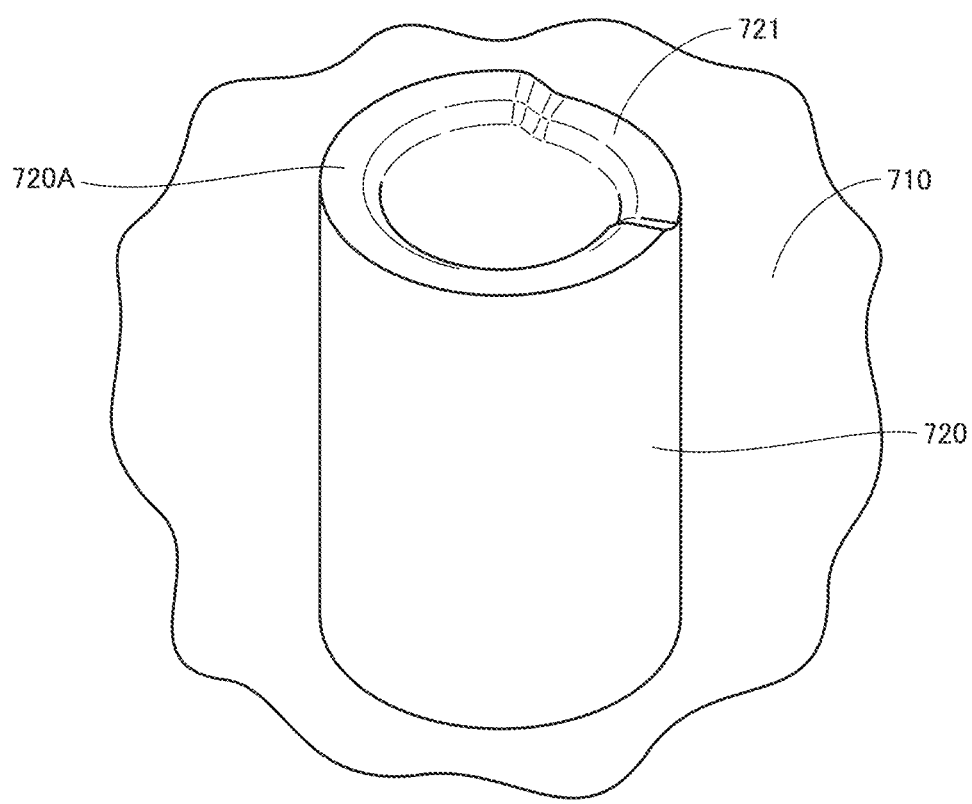
FIG. 10 is a perspective view showing a tubular protrusion of the cover member.

FIG. 10 is a perspective view showing the tubular protrusion of the cover member. As shown in FIG. 10, the tip of tubular protrusion 720 has: abutment surface 720A (abutment portion) in abutment with flexible printed circuit board 510; and a notch portion 721 (non-abutment portion) disposed beside the abutment portion in the peripheral direction of tubular protrusion 720 and separated from flexible printed circuit board 510.

Figure 11:
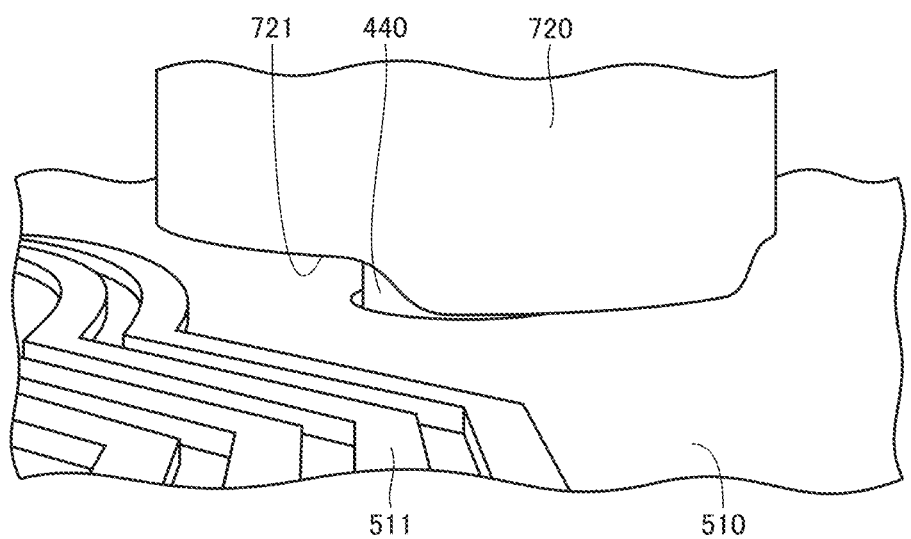
FIG. 11 is an enlarged view showing an abutment portion of the tubular protrusion in abutment with a flexible printed circuit board.

FIG. 11 is an enlarged view showing the abutment portion of the tubular protrusion in abutment with the flexible printed circuit board. As shown in FIG. 11, electric circuit 511 is formed on flexible printed circuit board 510. Tubular protrusion 720 is in abutment with flexible printed circuit board 510 at a position to avoid electric circuit 511. Specifically, electric circuit 511 on flexible printed circuit board 510 is provided on the outer peripheral side with respect to abutment surface 720A of tubular protrusion 720. Therefore, electric circuit 511 on flexible printed circuit board 510 is suppressed from being damaged due to the abutment of tubular protrusion 720. At a portion of flexible printed circuit board 510 at which electric circuit 511 reaches a position on the inner peripheral side with respect to abutment surface 720A of tubular protrusion 720, electric circuit 511 is suppressed from being damaged because notch portion 721 is provided at the tip portion of tubular protrusion 720.

Although the embodiments of the present invention have been described and illustrated in detail, it is clearly understood that the same is by way of illustration and example only and is not to be taken by way of limitation, the scope of the present invention being interpreted by the terms of the appended claims.

What is claimed is:

1. A power storage module, comprising:
   a stack in which a plurality of power storage cells are stacked in a stacking direction;
   a resin plate placed on the stack of the plurality of power storage cells;
   a flexible printed circuit board placed on the resin plate and having an electric circuit electrically connected to the plurality of power storage cells; and
   a cover member provided on the resin plate so as to cover the flexible printed circuit board, wherein
   the resin plate includes a projection that extends through the flexible printed circuit board,
   the cover member includes a tubular protrusion that protrudes toward the flexible printed circuit board on the resin plate, the projection is accommodated in an inner periphery of the tubular protrusion, wherein an outer peripheral surface of the projection is spaced from an inner peripheral surface of the tubular protrusion, and the tubular protrusion is in abutment with the flexible printed circuit board at a position to avoid the electric circuit.

2. The power storage module according to claim 1, wherein the tubular protrusion includes a tip portion, and the tip portion includes an abutment portion in abutment with the flexible printed circuit board, and a non-abutment portion disposed beside the abutment portion in a peripheral direction of the tubular protrusion and separated from the flexible printed circuit board.

3. The power storage module according to claim 2, wherein the non-abutment portion is constituted of a notch portion provided at the tip portion of the tubular protrusion.

4. The power storage module according to claim 1, wherein the resin plate includes a bottom surface on which the flexible printed circuit board is placed, the projection includes a first portion and a second portion, the first portion having a side surface perpendicular to the bottom surface, the second portion being provided at a position away from the bottom surface with respect to the first portion, the second portion having a diameter that is reduced in a direction away from the bottom surface, and the tubular protrusion extends beyond the second portion to reach a position outward in a radial direction of the first portion.

5. The power storage module according to claim 1, wherein each of the plurality of power storage cells includes a housing, two electrode terminals provided on the housing side by side in a direction orthogonal to the stacking direction, and a gas discharge valve provided in the housing between the two electrode terminals, the resin plate is provided with an opening located above the gas discharge valve, and the tubular protrusion and the projection are provided on each of both sides beside the opening in a direction in which the two electrode terminals are provided side by side.

6. The power storage module according to claim 1, wherein a plurality of the tubular protrusions and a plurality of the projections are provided along the stacking direction.

7. The power storage module according to claim 1, wherein the tubular protrusion has a tubular internal shape and a tubular external shape.

* * * * *